US011664828B1

(12) United States Patent
Afshar et al.

(10) Patent No.: US 11,664,828 B1
(45) Date of Patent: May 30, 2023

(54) SYSTEMS AND METHODS FOR MULTITHREADED SUCCESSIVE CANCELLATION LIST POLAR DECODING

(71) Applicant: Apple Inc., Cupertino, CA (US)

(72) Inventors: Hadi Afshar, San Diego, CA (US); Steve Hengchen Hsu, San Diego, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/484,982

(22) Filed: Sep. 24, 2021

(51) Int. Cl.
*H03M 13/45* (2006.01)
*H03M 13/39* (2006.01)
*H03M 13/37* (2006.01)
*H03M 13/33* (2006.01)
*H03M 13/00* (2006.01)

(52) U.S. Cl.
CPC ........ *H03M 13/451* (2013.01); *H03M 13/333* (2013.01); *H03M 13/3707* (2013.01); *H03M 13/3927* (2013.01); *H03M 13/455* (2013.01); *H03M 13/6572* (2013.01)

(58) Field of Classification Search
CPC .................................................. H03M 13/451
See application file for complete search history.

(56) References Cited

U.S. PATENT DOCUMENTS

| 10,644,836 | B2 | 5/2020 | Kudekar et al. | |
| 2009/0110124 | A1* | 4/2009 | Fatemi-Ghomi | H03M 13/4138 |
| | | | | 375/341 |
| 2009/0225878 | A1* | 9/2009 | Papadopoulos | H03M 13/6331 |
| | | | | 375/260 |
| 2020/0218607 | A1* | 7/2020 | Ha | H03M 13/1111 |
| 2021/0159916 | A1* | 5/2021 | Maunder | H03M 13/6561 |

OTHER PUBLICATIONS

Yuan B, Parhi K K. LLR-based successive-cancellation list decoder for polar codes with multi-bit decision. IEEE Trans Circuits Syst II Express Briefs, 2016 (Year: 2016).*
Alexios Balatsoukas-Stimming, Mani Bastani Parizi, Andreas Burg, "LLR-Based Successive Cancellation List Decoding of Polar Codes", IEEE Transactions on Signal Processing, vol. 63, No. 19, 2015. (Year: 2015).*
Yuan, Bo et al., "Successive Cancellation List Polar Decoding using Log-likelihood Ratios." Department of Electrical and Computer Engineering, University of Minnesota Twin Cities. 2014. 5 pages.

(Continued)

*Primary Examiner* — Joseph D Torres
(74) *Attorney, Agent, or Firm* — Kilpatrick Townsend & Stockton LLP

(57) ABSTRACT

A polar decoder circuit can execute successive cancellation list polar decoding on multiple threads concurrently. An LLR update engine of the polar decoder circuit and a sort engine of the polar decoder circuit can operate concurrently, with the LLR update engine computing updated path metrics for one codeword while the sort engine sorts candidates for one or more other codewords according to path metrics already computed by the LLR update engine. Threads corresponding to different codewords can cycle sequentially between the LLR update engine and the sort engine.

20 Claims, 7 Drawing Sheets

(56) References Cited

OTHER PUBLICATIONS

Xiong, Chenrong et al., "A multi-mode area-efficient SCL polar decoder." IEEE. Oct. 26, 2015. (Published 2016, Computer Science, Mathematics, IEEE Transactionon Very Large Scale Integration (VLSI) Systems. 13 pages.

Yuan, Bo, "Algorithm and VLSI Architecture for Polar Codes Decoder." A dissertation submitted to the faculty of the Graduate School of the University of Minnesota. Jul. 2015. 149 pages.

* cited by examiner

| STEP # | LLR UPDATE ENGINE | SORT ENGINE | | | OUTPUT ENGINE |
|---|---|---|---|---|---|
| | | STAGE 1 | STAGE 2 | STAGE 3 | |
| 1 | A | - | - | - | - |
| 2 | B | A | - | - | - |
| 3 | C | B | A | - | - |
| 4 | D | C | B | A | - |
| 5 | A | D | C | B | - |
| ⋮ | ⋮ | ⋮ | ⋮ | ⋮ | ⋮ |
| 37 | A | D | C | B | - |
| 38 | B | - | D | C | A |
| 39 | C | B | - | D | - |
| 40 | D | C | B | - | - |
| 41 | E | D | C | B | - |
| 42 | B | E | D | C | - |

*FIG. 7*

SYSTEMS AND METHODS FOR MULTITHREADED SUCCESSIVE CANCELLATION LIST POLAR DECODING

This disclosure includes subject matter related to U.S. Application Ser. No. 17/448,869, filed Sep. 24, 2021, the disclosure of which is incorporated herein by reference.

BACKGROUND

The present disclosure relates generally to cellular data processing and, in particular, to multithreaded successive cancellation list polar decoding.

With the advent of high-speed cellular data communication, users of mobile devices are increasingly able to access information when and where they need it. Cellular data communication standards, promulgated by the 3rd Generation Partnership Project (3GPP), enable radio-frequency communication between a base station (typically implemented at a cellular antenna tower) and various user equipment ("UE"), which can be a mobile device such as a smart phone, tablet, wearable device, or the like, via an "uplink" from the UE to the base station and a "downlink" from the base station to the UE.

Standards promulgated by 3GPP include specifications for radio access networks (RANs), such as 4G Long-Term Evolution (referred to herein as "4G" or "LTE") and 5G New Radio (referred to herein as "5G" or "NR"). The 4G and 5G RAN specifications define multiple logical channels between the base station and the UE, including a physical uplink shared channel (PUSCH) and physical downlink shared channel (PDSCH) that transmit application-layer data, as well as a physical uplink control channel (PUCCH) and physical downlink control channel (PDCCH) that transmit control data used to specify various parameters associated with data transmission on the shared channels.

The specifications also define the sequence of operations used to prepare data for transmission as a radio-frequency (RF) signal on each channel, including channel coding to enable error correction. At the receiving end, the receiver decodes the data and corrects errors. For example, for PDCCH in a 5G RAN, polar coding is used to encode downlink control information (DCI) that includes parameters for both downlink and uplink data channels. The UE that receives the DCI needs to decode the DCI in order to correctly decode received (downlink) data and in order to correctly encode uplink data for transmission.

For polar coding, the successive cancellation list (SCL) decoding algorithm is commonly used. SCL performs a sequential estimation of information bits by traversing a binary tree and estimating path metrics for multiple codeword candidates. Based on the path metrics, the list of codeword candidates can be pruned. The process of computing path metrics and selecting the best candidates is iterative in nature. To meet the throughput and latency demands of high-speed networks, efficient hardware implementations of SCL decoding are desirable.

SUMMARY

According to some embodiments, a polar decoder circuit can execute successive cancellation list polar decoding on multiple threads concurrently. An LLR update engine of the polar decoder circuit and a sort engine of the polar decoder circuit can operate concurrently, with the LLR update engine computing updated path metrics for one codeword while the sort engine sorts candidates for one or more other codewords according to path metrics already computed by the LLR update engine. Threads corresponding to different codewords can cycle sequentially between the LLR update engine and the sort engine.

Some embodiments relate to a polar decoder that can include a log likelihood ratio (LLR) memory, a multithreaded LLR update engine, a sort engine, and synchronization logic. The log likelihood ratio (LLR) memory can have storage areas configured to store LLRs associated with nodes in a binary tree representing a space of possible decoded codewords corresponding to a received codeword, where different storage areas store LLRs for different received codewords. The multithreaded LLR update engine can be coupled to the LLR memory and configured to: update the LLRs stored in the storage areas of the LLR memory; compute path metrics for a plurality of candidate paths through a portion of the binary tree corresponding to a current decoding stage; and write updated path metrics for the plurality of candidate paths for the current decoding stage to a first set of registers. The sort engine can be coupled to the LLR update engine and can have one or more sort stages configured to operate sequentially to sort the plurality of candidate paths from the first set of registers based on the path metrics and to write the sorted candidate paths to a second set of registers. The LLR update engine and the sort engine can operate iteratively to traverse the binary tree during a series of decoding stages to generate a final list of candidates for a decoded codeword corresponding to a received encoded codeword. The synchronization logic can be coupled to the LLR update engine and the sort engine and configured to generate synchronization signals such that the multithreaded LLR update engine and the one or more sort stages of the sort engine operate concurrently on different threads corresponding to different received codewords. In some embodiments, the LLR update engine can implement successive cancellation list (SCL) polar decoding and can maintain, e.g., at least eight candidate paths.

In some embodiments, the LLR update engine can include a thread context register file configured to store context information for each of the threads. In various embodiments, the context information can include the candidate paths and path metrics for a particular thread and/or an indicator of a decoding stage for a particular thread.

In some embodiments, the number of concurrent threads can be one greater than a number of sort stages in the sort engine. In some embodiments, the sort engine can include at least two sort stages, and different sort stages can operate concurrently on different threads of the plurality of threads.

In some embodiments, the LLR update engine can include a number of radix-4 f/g processing engines configured to perform f/g computations for three nodes.

In some embodiments, an output engine can be coupled to the LLR update engine and configured to produce a decoded codeword based on a final set of candidate paths provided by the LLR update engine.

Some embodiments relate to a cellular modem processor having a decoder pipeline that includes a polar decoder circuit. The polar decoder circuit can include a log likelihood ratio (LLR) memory, a multithreaded LLR update engine, a sort engine, and synchronization logic. The log likelihood ratio (LLR) memory can have storage areas configured to store LLRs associated with nodes in a binary tree representing a space of possible decoded codewords corresponding to a received codeword, where different storage areas store LLRs for different received codewords. The multithreaded LLR update engine can be coupled to the LLR memory and configured to: update the LLRs stored in the storage areas of the LLR memory; compute path metrics for a plurality of candidate paths through a portion of the binary tree corresponding to a current decoding stage; and write updated path metrics for the plurality of candidate paths for the current decoding stage to a first set of registers. The sort engine can be coupled to the LLR update engine and can have one or more sort stages configured to operate sequentially to sort the plurality of candidate paths from the first set of registers based on the path metrics and to write the sorted candidate paths to a second set of registers. The LLR update engine and the sort engine can operate iteratively to traverse the binary tree during a series of decoding stages to generate a final list of candidates for a decoded codeword corresponding to a received encoded codeword. The synchronization logic can be coupled to the LLR update engine and the sort engine and configured to generate synchronization signals such that the multithreaded LLR update engine and the one or more sort stages of the sort engine operate concurrently on different threads corresponding to different received codewords. In some embodiments, the LLR update engine can implement successive cancellation list (SCL) polar decoding and can maintain, e.g., at least eight candidate paths.

In some embodiments, the decoder pipeline can be configured to decode a physical downlink control channel (PDCCH) for a 5G radio area network.

In some embodiments, the sort engine can include at least two sort stages and different sort stages can operate concurrently on different threads. In some embodiments, the number of threads can be one greater than a number of sort stages in the sort engine.

In some embodiments, the polar decoder circuit can also include an output engine coupled to the LLR update engine and configured to produce a decoded codeword based on a final set of candidate paths provided by the LLR update engine.

Some embodiments relate to a method of operating a polar decoder circuit having a log likelihood ratio (LLR) update engine and a sort engine having one or more sort stages. The method can include: computing, in the LLR update engine, path metrics for a set of candidate paths for a first codeword; concurrently with computing the path metrics, sorting, in the sort engine, respective sets of candidate paths for one or more additional codewords including a second codeword; responsive to completion of computing the path metrics for the set of candidate paths for the first codeword and sorting of the set of candidate paths for the one or more additional codewords, advancing the set of candidate paths for the first codeword to the sorting engine and advancing the set of candidate paths for the second codeword to the LLR update engine; thereafter computing, in the LLR update engine, updated path metrics for an updated set of candidate paths for the second codeword; and concurrently with computing the updated path metrics, sorting, in the sort engine, a set of candidate paths for one or more additional codewords including the first codeword.

In some embodiments, the one or more additional codewords can include at least a second codeword and a third codeword, and sorting respective sets of candidate paths for one or more additional codewords can include: sorting a set of candidate paths for the second codeword in a first stage of the sort engine; and sorting a set of candidate paths for the third codeword in a second stage of the sort engine, wherein the first and second stages of the sort engine operate concurrently.

In some embodiments, computing the path metrics for the first codeword include reading LLRs from a first region in an LLR memory, and computing the path metrics for the second codeword can include reading LLRs from a second region in the LLR memory.

In some embodiments, the method can also include determining, by the LLR update engine, that a final stage of decoding for the first codeword is complete. In response to determining that the final stage of decoding for the first codeword is complete, an output engine of the polar decoder circuit can generate a decoded codeword for the first codeword.

The following detailed description, together with the accompanying drawings, will provide a better understanding of the nature and advantages of the claimed subject matter.

BRIEF DESCRIPTION OF THE DRAWINGS

FIG. 7 shows a timing chart further illustrating operation of a multithreaded SCL polar decoder circuit according to some embodiments.

DETAILED DESCRIPTION

The following description of exemplary embodiments is presented for the purpose of illustration and description. It is not intended to be exhaustive or to limit the claimed embodiments to the precise form described, and persons skilled in the art will appreciate that many modifications and variations are possible. The embodiments have been chosen and described in order to best explain their principles and practical applications to thereby enable others skilled in the art to best make and use various embodiments and with various modifications as are suited to the particular use contemplated.

Figure 1:
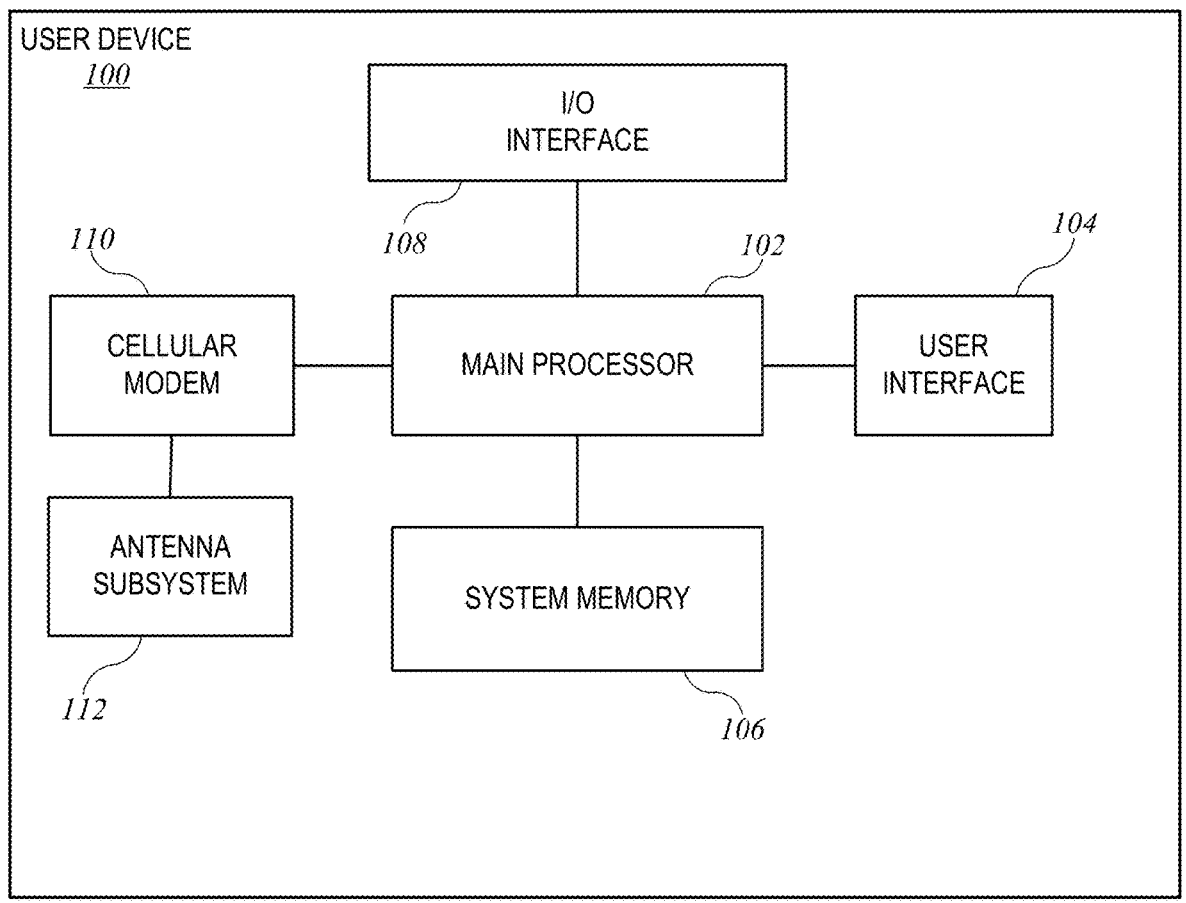
FIG. 1 is a simplified block diagram of a user device according to some embodiments.

FIG. 1 is a simplified block diagram of a user device 100 according to some embodiments. User device 100 can be, for example, a mobile device such as a smartphone, tablet computer, laptop computer, wearable device, or any other electronic device capable of operating as user equipment (UE) in a cellular radio area network. User device 100 is representative of a broad class of user-operable devices that may incorporate a cellular modem as described herein, and such devices can vary widely in capability, complexity, and form factor.

Main processor 102 can include, e.g., one or more single-core or multi-core microprocessors and/or microcontrollers executing program code to perform various functions associated with user device 100. For example, main processor 102 can execute an operating system and one or more application programs compatible with the operating system. In some instances, the program code may include instructions to send information to and/or receive information from other devices or systems, e.g., via a cellular data network such as a 4G or 5G network.

User interface 104 can include user-operable input components such as a touch pad, touch screen, scroll wheel, click wheel, dial, button, switch, keypad, keyboard, microphone, or the like, as well as output components such as a video screen, indicator lights, speakers, headphone jacks, haptic motors, or the like, together with supporting electronics (e.g., digital-to-analog or analog-to-digital converters, signal processors, or the like). Depending on the implementation of a particular user device 100, a user can operate input components of user interface 104 to invoke functionality of user device 100 and/or receive output from user device 100 via output components of user interface 104. In some embodiments, user device 100 may have a limited user interface (e.g., a small number of indicator lights and/or buttons) or no user interface.

System memory 106 can incorporate any type and combination of data storage media, including but not limited to random-access memory (e.g., DRAM, SRAM), flash memory, magnetic disk, optical storage media, or any other non-transitory storage medium, or a combination of media, and can include volatile and/or non-volatile media. System memory 106 can be used to store program code to be executed by main processor 102 and any other data or instructions that may be generated and/or used in the operation of user device 100.

Input/output (I/O) interface 108 can include hardware components and supporting software configured to allow user device 100 to communicate with other devices via point-to-point or local area network links. In some embodiments, I/O interface 108 can support short-range wireless communication (e.g., via Wi-Fi, Bluetooth, or other wireless transports) and can include appropriate transceiver and signal processing circuitry and software or firmware to control operation of the circuitry. Additionally or instead, in some embodiments, I/O interface 108 can support a wired connection to another device.

To enable communication via cellular networks, including cellular data communication, user device 100 can include a cellular modem 110 coupled to an antenna subsystem 112. Cellular modem 110 can be implemented as a microprocessor or microcontroller that acts as a co-processor to main processor 102. In some embodiments, cellular modem 110 and main processor 102 can be implemented as integrated circuits fabricated on a common substrate, e.g., as part of a system-on-a-chip design. Example implementations of cellular modem 110 are described below.

Antenna subsystem 112 can include an antenna, which can be implemented using a wire, metal traces, or any other structure capable of radiating radio-frequency (RF) electromagnetic fields and responding to RF electromagnetic fields at frequencies used in cellular data communication. For instance, 4G and 5G networks currently use various spectrum bands, including bands at 700 MHz, 850 MHz, 900 MHz, 1.5 GHz, 1.8 GHz, 2.1 GHz, 2.5 GHz and 3.5 GHz. Antenna subsystem 112 can also include circuitry to drive the antenna and circuitry to generate digital signals in response to received RF signals. A particular antenna implementation is not critical to understanding the present disclosure, and those skilled in the art will know of numerous implementations. In some embodiments, antenna subsystem 112 can be shared between cellular modem 110 and I/O interface 108; for instance, the same antenna can be used to support any combination of cellular, Wi-Fi, and/or Bluetooth communications.

User device 100 can also include other components not shown in FIG. 1. For example, in various embodiments, user device 100 can include one or more data storage devices using fixed or removable storage media; a global positioning system (GPS) and/or other global navigation satellite system (GNSS) receiver; a camera; a microphone; a speaker; a power supply (e.g., a battery); power management circuitry; any number of environmental sensors (e.g., temperature sensor, pressure sensor, accelerometer, chemical sensor, optical sensor, etc.); and so on. Accordingly, user device 100 can provide a variety of functions, some or all of which may be enhanced by or reliant on cellular data communication supported by cellular modem 110.

Figure 2:
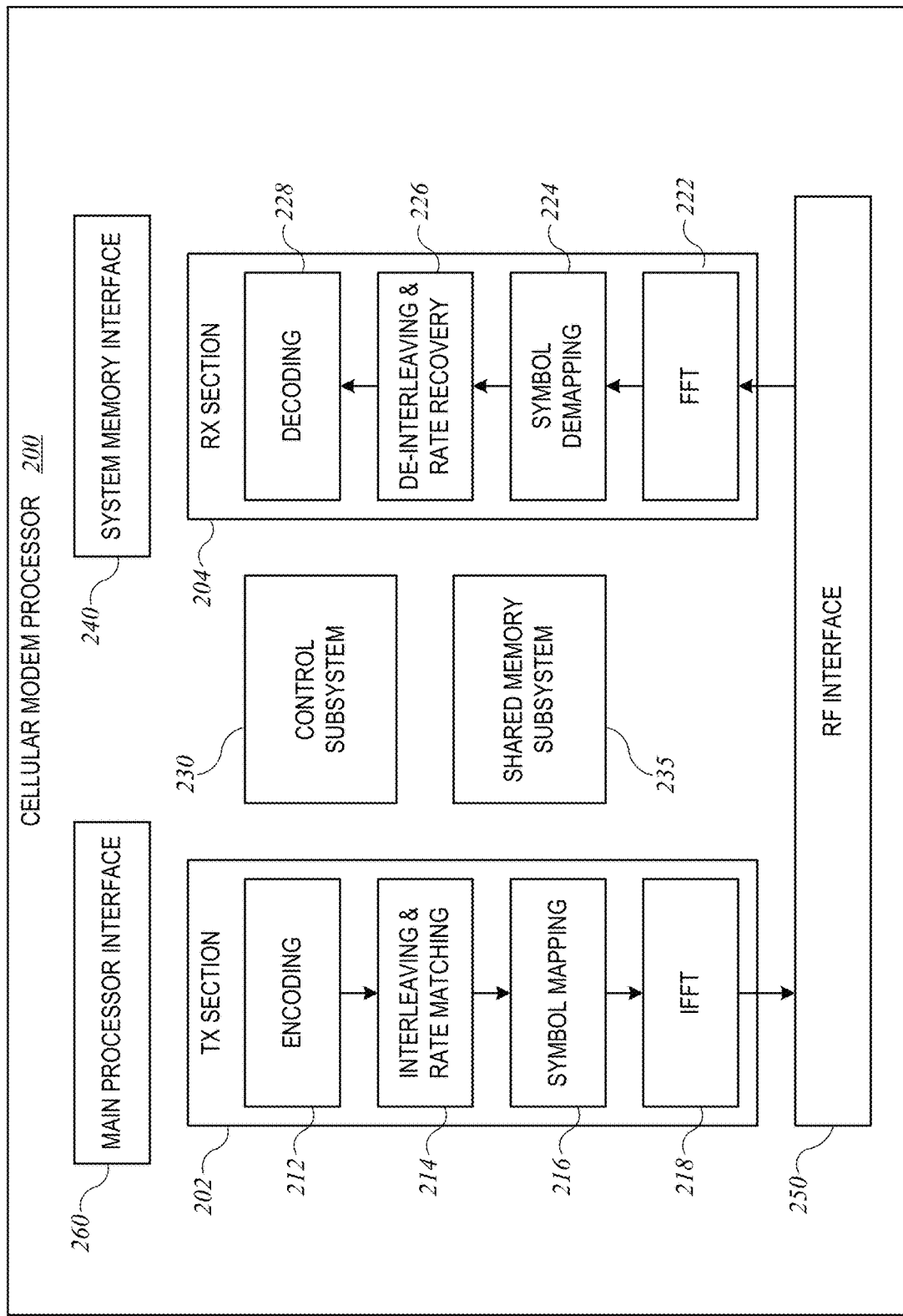
FIG. 2 is a simplified block diagram of a cellular modem processor according to some embodiments.

FIG. 2 is a simplified block diagram of a cellular modem processor 200 according to some embodiments. Cellular modem processor 200 can implement all or part of cellular modem 110 of FIG. 1. In various embodiments, cellular modem processor 200 can operate as user equipment (UE) in a cellular radio access network such as a 4G network and/or a 5G network.

Cellular modem processor 200 can include a transmit (TX) section 202 and a receive (RX) section 204. TX section 202 can include one or more data processing pipelines to prepare data for transmission via antenna subsystem 110, and RX section 204 can include one or more data processing pipelines to reconstruct transmitted data from signals received via antenna subsystem 110. Cellular modem processor 200 can also include a control subsystem 230, a shared memory subsystem 235 and various interfaces to other system components, such as a system memory interface 240, an RF interface 250, and a main processor interface 260.

Data processing pipelines in TX section 202 and RX section 204 can include logic circuitry (e.g., any combination of fixed-function and/or programmable circuitry) that implements a specific sequence of operations and associated storage circuitry (e.g., registers, data buffers, and/or other memory circuits) to store data being operated on. The operations can conform to the specifications of a particular cellular data network, including 4G and/or 5G networks. For example, shown in TX section 202 are an encoding unit 212, an interleaving and rate-matching unit 214, a symbol mapping unit 216, and an inverse Fast Fourier Transform (IFFT) unit 218. Encoding unit 212 can perform code block segmentation and channel coding for a particular channel (e.g., for PUCCH or PUSCH). The encoding operations can be specific to a particular channel and/or a particular communication standard. For instance, 4G PUSCH channel coding operations can include CRC (cyclic redundancy check) calculation and Turbo coding; 4G PUCCH channel coding operations can include CRC calculation and convolutional coding; 5G PUSCH channel coding operations can include CRC calculation and low-density parity check (LDPC) coding; and 5G PUCCH channel coding operations can include CRC calculation and polar coding. Interleaving and rate-matching unit 214 can perform interleaving and rate matching operations on encoded code blocks. As with encoding operations, interleaving and rate matching operations can depend on the particular channel and/or particular communication standard. For instance, in 4G PUSCH, interleaving precedes rate matching, while 5G PUSCH reverses the order. Symbol mapping unit 216 can receive bit sequences for code blocks after encoding, rate-matching and interleaving and can map the bit sequences onto symbols in an appropriate constellation for each of a set of orthogonal frequency division multiplexing (OFDM) subcarriers. Again, the mapping can depend on the particular channel and/or communication standard. Due to such differences, dedicated hardware pipelines can be constructed to support different physical channels (e.g., PUSCH vs. PUCCH) and/or different communication standards (e.g., 4G vs. 5G), or multipurpose pipelines that share hardware can be constructed. IFFT unit 218 receives the symbols from symbol mapping unit 216. Each symbol can be, e.g., a complex number representing an amplitude and phase. IFFT unit 218 can perform an IFFT to transform the symbols to a sample sequence in the time domain. This sample sequence can be provided to RF interface 250.

RF interface 250 can be an interface to antenna subsystem 112 of FIG. 1 and can convert the sample sequence to an analog signal that is mixed onto the carrier frequency and transmitted via an antenna. RF interface 250 can also down-convert received RF signals to baseband and convert the baseband analog signal to a sequence of digital samples. Digital sample sequences can be provided to pipelines in RX section 204.

As with TX section 202, operations in RX section 204 can conform to the specifications of a particular cellular data network, including 4G and/or 5G networks. For example, shown in RX section 204 are a Fast Fourier Transform (FFT) unit 222, a symbol demapping unit 224, a de-interleaving and rate recovery unit 226, and a decoding unit 228. FFT unit 222 can receive, via RF interface 250, a sequence of samples representing a received (baseband) signal and can perform an FFT to transform the samples from time domain to frequency domain. Symbol demapping unit 224 can perform demapping and symbol-decoding operations to generate a representation of the bits that were transmitted. The decoding operation can be a soft decoding operation that produces log likelihood ratios (LLRs) or other estimates of the relative probability of a given bit being 0 or 1. De-interleaving and rate recovery unit 226 can reverse the interleaving and rate matching operations that were performed at the transmitter. Decoding unit 228 can perform channel decoding to decode the code blocks and recover the data. As with corresponding components in TX section 204, the operations implemented in demapping unit 224, de-interleaving and rate recovery unit 226, and decoding unit 228 can be specific to a particular channel and/or a particular communication standard. Due to such differences, dedicated hardware pipelines can be constructed to support different physical channels (e.g., PDSCH vs. PDCCH) and/or different communication standards (e.g., 4G vs. 5G), or multi-purpose pipelines that share hardware can be constructed.

Operation of the pipelines in TX section 202 and RX section 204 can be coordinated by control subsystem 230. Control subsystem 230 can include circuitry to manage communication between units in TX section 202 and RX section 204 and other components of cellular modem processor 200 (e.g., RF interface 250, main processor interface 260, and system memory interface 240) and/or between cellular modem processor 200 and other components of a device or system (e.g., user device 100 of FIG. 1) in which cellular modem processor 200 operates. A variety of implementations can be used, including various combinations of fixed-function circuitry and programmable circuitry executing program code provided as firmware. Shared memory subsystem 235 can include memory circuits (e.g., SRAM, DRAM, or the like), a read interface and a write interface connected via crossbars to TX section 202 and RX section 204 (or to individual units in TX section 202 and/or RX section 204), and arbitration logic to manage multiple requests (e.g., using time division multiplexing or other techniques). In some embodiments, shared memory subsystem 235 can be implemented such that any unit in TX section 202 or RX section 204 can access any location in the shared memory. A variety of architectures, including conventional architectures, can be used. In some embodiments, shared memory subsystem 235 can be used to transfer data into and out of TX section 202 and/or RX section 204, or between units within TX section 202 and/or RX section 204.

Main processor interface 260 can enable communicating with main processor 102 (shown in FIG. 1), via an interface such as Advanced eXtensible Interface (AXI), which is part of ARM Advanced Microcontroller Bus Architecture, or any other suitable interface for communication between a main processor and a coprocessor. Other interfaces to other components of user device 100 can also be provided, such as a system memory interface 240 that provides a direct memory access (DMA) interface to transfer data between shared memory subsystem 235 and system memory 106 of FIG. 1.

It will be appreciated that cellular modem processor 200 is illustrative and that variations and modifications are possible. A cellular modem processor can include any number and combination of pipelines, supporting any number and combination of cellular data communication standards. Control subsystems, memory subsystems and interfaces to other components can be varied as desired. In some embodiments, cellular modem processor 200 can have a high throughput to support high-speed cellular networks (e.g., 12 Gbps for a 5G network).

To provide high throughput, a cellular modem processor can include a number of pipelines, where each pipeline can includes a number of dedicated circuits configured to perform specific operations associated with data communication; examples include encoding, decoding, interleaving, rate matching, de-interleaving, de-rate-matching, computing cyclic redundancy check (CRC) bits, performing CRC, and so on. In some embodiments, some or all of the pipelines can be implemented using a general architectural framework that provides flexible (firmware-based) control with a data synchronization mechanism that is independent of the particular functionality of a pipeline or pipeline stage. Examples of pipeline architectures, including pipeline architectures for a PDCCH decoding pipeline are described in above-referenced U.S. application Ser. No. 17/448,869. In some embodiments, a multithreaded successive cancellation list (SCL) polar decoder can be implemented in a PDCCH pipeline, e.g., to provide decoding for 5G PDCCH. However, those skilled in the art will appreciate that multi-threaded SCL polar decoders of the kind described herein can be employed in a variety of contexts, not limited to any particular pipeline architecture.

In 5G networks, polar coding is typically used for PDCCH and PUCCH. Polar coding is an error-correction coding technique that allows an input bit sequence representing information to be correctly reconstructed at a receiver, even if bit errors occur in transmission. To facilitate error detection and correction, polar coding constructs a codeword that can include "frozen" bits (certain bits in the sequence whose value is fixed) and cyclic redundancy check (CRC) bits, in addition to bits that carry information. In polar coding, bits ($in_1$, $in_2$) of the codeword are used to generate bits ($out_1$, $out_2$) of an encoded codeword according to the rule that $out_1 = in_1 \oplus in_2$ and $out_2 = in_2$, where $\oplus$ denotes the exclusive-OR function. Polar decoding involves reconstructing the original input bit sequence based on the received codeword bits and the coding rule. The received codeword bits are subject to channel noise and may be represented by log likelihood ratios (LLRs), indicating the relative likelihood that the corresponding transmitted bit was a 1 or 0. Decoding pipelines for 5G-compatible devices can include polar decoder circuits to reconstruct the input bit sequence using available information, which can include the LLRs for a received codeword, the polar coding equations (which imply certain correlations between bits), the pattern of frozen bits, and the CRC bits.

Successive cancellation ("SC") polar decoding is a technique that can be implemented as a binary tree search of possible codewords. The ith level of the binary tree can represent the ith bit of the codeword, and any possible input bit sequence has a corresponding path through the tree. To decode a received bit sequence, SC polar decoding begins with probability estimates that each received bit was transmitted as 0 or 1. (The received bits are the encoded bits.) These estimates can be expressed as a log likelihood ratio (LLR) for each bit. The algorithm traverses the tree, starting at the root node (level 0). At each level i, path metric functions (typically referred to as f and g functions) are computed for the two child nodes (0 and 1) at level (i+1). The path metric function reflects the probability of the (i+1)th bit of the codeword being 0 or 1, given the LLRs of received bits and the polar coding rule (and, if applicable, the presence of a frozen bit at a particular position in the codeword). Because the polar coding rule introduces correlations between successive bits, the computation for level (i+1) depends on previous levels. In successive cancellation, the node at the (i+1)th level is selected by choosing the higher probability (subject to constraints, such as the presence of frozen bits in the codeword) and the process is repeated for the next level. By traversing the tree and choosing one child at each level, a (decoded) codeword can be produced. SC polar decoding involves a hard decision at each level of the binary tree, and because the most likely path at a particular node is not necessarily the correct path, SC polar decoding generally does not yield optimal results.

SCL polar decoding is an improvement on SC polar decoding that considers multiple candidate codewords (or multiple paths through the binary tree). For each candidate, a path metric is computed using the same path metric functions as in successive cancellation. After path metrics for all candidates have been computed, the candidate with the best path metric can be selected as the decoded codeword. (Depending on how the path metric is defined, the "best" path metric can have either highest or lowest value.) SCL polar decoding can, in principle, consider any number of candidate codewords. In practice, however, considering all candidate codewords may be impractical. For instance, for a codeword of 512 bits, there are $2^{512}$ possible paths through a binary tree. This may be reduced somewhat if some of the bits are frozen, but computing even $2^{128}$ or $2^{64}$ path metrics in real time is not feasible given present computing technology. Accordingly, various optimizations are usually employed.

One standard optimization is to limit the number of candidates to some maximum number (L). At each level of the tree, or stage of decoding, starting from the root, all child nodes are considered as candidates until the stage at which the number of candidates reaches L. At that point, for each candidate, the two child nodes are considered, resulting in 2L candidates. The path metrics for the 2L candidates are compared, and the L candidates with the best path metrics are retained while the others are discarded. The L retained candidates (also referred to as "survival paths") proceed to the next stage, where the same process is repeated. Once all stages are complete, the most likely candidate can be selected as the decoded codeword. The most likely candidate can be identified based on having the best path metric as well as other considerations such as whether the candidate with the best path metric passes CRC.

Even with a limited number of candidates, implementing SCL polar decoding with high throughput poses numerous challenges. For instance, at each stage of decoding, LLRs for various nodes in the binary tree (which can be used to represent the path metrics) need to be updated to generate the candidate list for the current stage, after which the candidates need to be sorted according to path metric so that survival paths can be selected for the next stage. Circuits that can do each of these tasks (LLR updates and sorting) are known in the art. However, the nature of SCL polar decoding generally leads to poor hardware utilization and a low ratio of throughput to area. For instance, since LLR updating and sorting cannot occur at the same time, the sorting circuitry generally sits idle while the LLR update circuitry is operating and vice versa.

Figure 3:
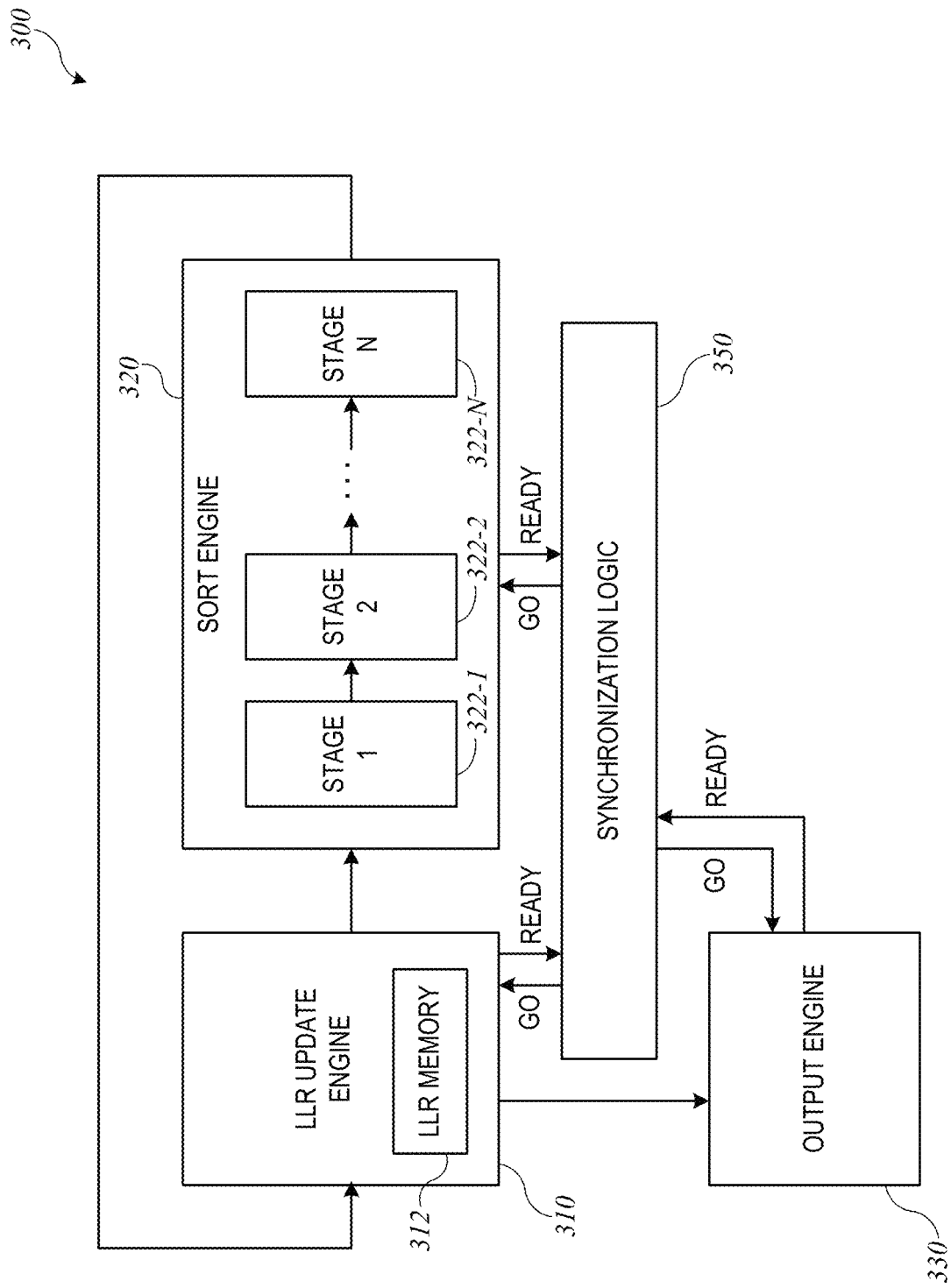
FIG. 3 is a simplified schematic diagram of a multithreaded SCL polar decoder circuit according to some embodiments.

Some embodiments can provide improved throughput by supporting multiple concurrent decoding threads, which each thread operating on a different codeword. FIG. 3 is a simplified schematic diagram of a multithreaded SCL polar decoder circuit 300 according to some embodiments. Circuit 300 can include a LLR update engine 310, a sort engine 320, an output engine 330, and thread synchronization logic 350. LLR update engine 310 can include processing engines that compute updated LLRs at each stage of decoding, producing a set of (up to) 2L candidates. LLR update engine 310 can also include an LLR memory 312 that stores the LLRs for a codeword.

Sort engine 320 can include a series of sort stages 322-1 through 322-N arranged to sort an unordered list of 2L elements into a sorted list of 2L elements. In operation, LLR update engine can compute a set of path metrics for candidates at a given decoding stage and provide the candidates to sort engine 320. For example, for each candidate, the path metric and a candidate identifier can be provided. Sort engine 320 can sort the candidates based on path metrics (preserving the association between a candidate identifier and its path metric) and return the sorted list to LLR update engine 310. In some embodiments, sort engine 320 can return the full sorted list (e.g., up to 2L candidates) to LLR update engine 310, and LLR update engine 320 can cull the list to L candidates for the next stage; alternatively, sort engine 320 can cull the list and return the top L candidates. Output engine 330 can operate once all decoding stages for a codeword are complete. For example, after the list of candidates from the last decoding stage has been sorted, LLR update engine 310 can provide the L candidates with the best path metrics to output processing unit 330. Output engine 330 can perform deinterleaving of the decoded codeword, perform CRC, compute other metrics, and generate the final decoder output. The final decoder output can include the decoded codeword (a reconstruction of the original input bit sequence representing the transmitted information). In some embodiments, the final decoder output can also include other information such as any or all of the metrics, status codes (e.g., indicating a decoder failure if no candidate that passed CRC was found), and any other information that may be useful to entities outside of circuit 300.

To enhance throughput, LLR update engine 310 and sort engine 320 can support multithreaded operation, with each thread corresponding to a different codeword. For example, LLR update engine 310 can compute path metrics for the next decoding stage for one codeword, while sort engine 320 operates to sort candidate lists for one or more other codewords. In some embodiments, each sort stage 322 of sort engine 320 can operating concurrently on candidate lists associated with different codewords. If the number of sort stages 322 in sort engine 320 is N, then the number of concurrent threads (or codewords) in circuit 300 can be N+1: one thread in each sort stage 322 and one thread in LLR update engine 310. If desired, fewer than N+1 concurrent threads can be supported (with the tradeoffs including more idle time for the hardware), or more than N+1 concurrent threads can be supported (with the tradeoff being increased latency, as some threads would be waiting for resources at any given time). Output engine 330 can operate on one codeword at a time, after decoding for that codeword is completed. Unlike LLR update engine 310 and sort engine 320, output engine 330 in embodiments described herein operates once per codeword rather than once per decoding stage.

Synchronization logic 350 can coordinate thread switching for circuit 300. In some embodiments, LLR update engine 310, sort engine 320, and output engine 330 can send respective "Ready" signals to synchronization logic 350 to indicate when that engine has finished its processing operations for its current thread and is ready to process its next thread. When "Ready" signals have been received from LLR update engine 310, sort engine 320, and output engine 330, synchronization logic 350 can generate a "Go" signal to LLR update engine 310, sort engine 320, and output engine 330. The "Go" signal can be sent to LLR update engine 310, sort engine 320, and output engine 330 at the same time. In response to receiving the "Go" signal, LLR update engine 310, sort engine 320, and output processing unit 330 can reset their "Ready" signals and begin operating on their respective next threads (which can correspond to different codewords as described below). In this manner, LLR update engine 310, sort engine 320, and output engine 330 can all operate at the same time.

Figure 4:
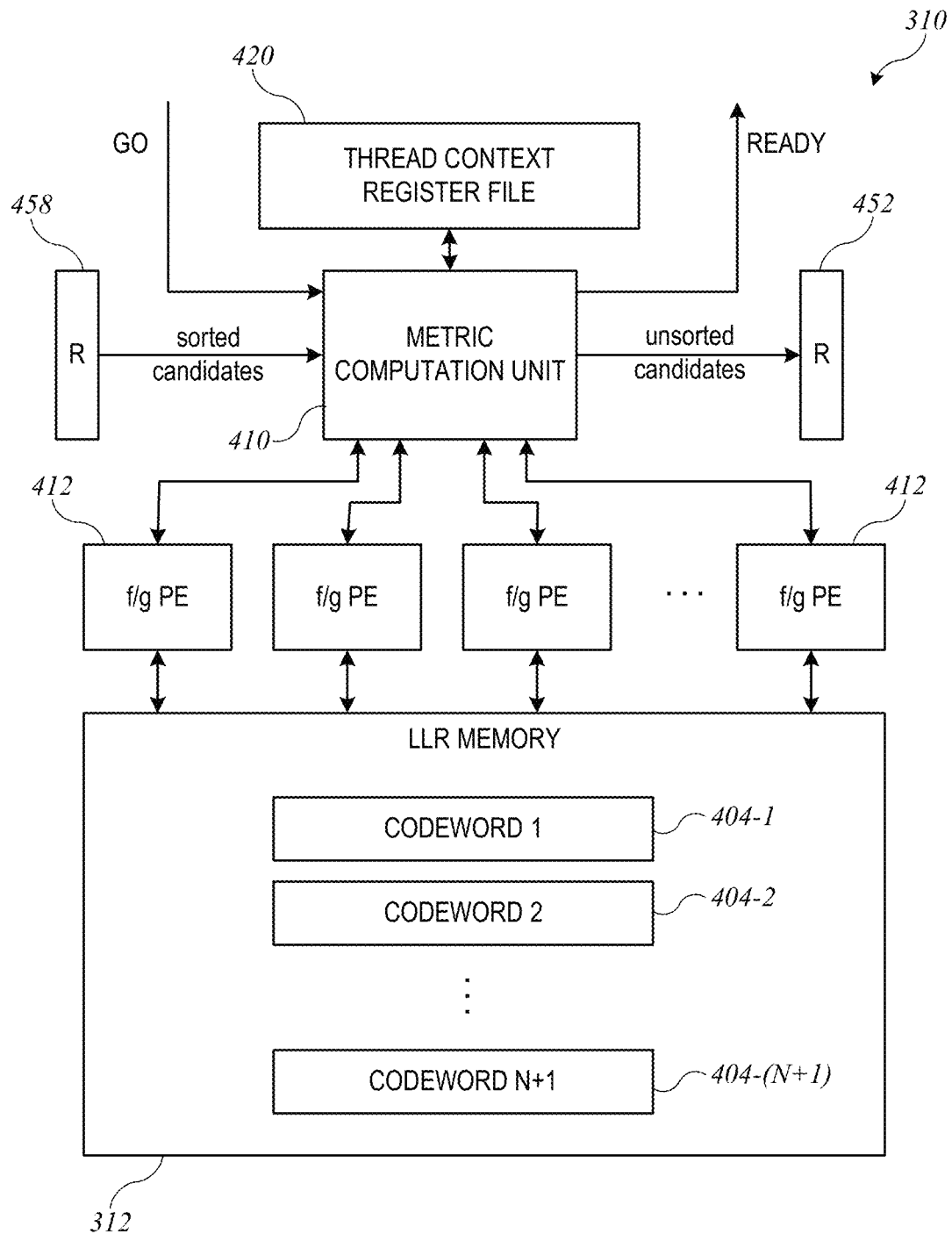
FIG. 4 shows a simplified schematic diagram of a multithreaded LLR update engine according to some embodiments.

FIG. 4 shows a simplified schematic diagram of LLR update engine 310 according to some embodiments. LLR update engine 310 can include LLR memory 312, a metric computation unit 410, a number of f/g processing engines 412, and a thread-context register file 420.

LLR memory 312 can include sufficient area to store decoding data (e.g., per-node LLRs) for a number of codewords that is at least equal to the number of concurrent threads. In the example shown, LLR memory 312 includes codeword storage areas 404-1 through 404-(N+1), where N+1 is the number of concurrent threads. Data stored in LLR memory 312 for each codeword can include LLRs associated with various nodes, which are updated as decoding progresses. In embodiments where only one thread at a time is active in LLR update engine 310, LLR memory 312 can be a dual-port memory circuit with no need for arbitration among requests from different threads.

Each f/g processing engine 412 can implement computation of the f and g functions that are commonly used in SCL polar decoding to recursively update LLRs. For instance, for LLR-based SCL polar decoding, the f and g functions can be defined as:

$$f(a,b)=\operatorname{sign}(a)\operatorname{sign}(b)\min(|a|,|b|) \quad (1)$$

and $$g(a,b)=a(-1)^{\hat{u}_{sum}}+b \quad (2)$$

where a and b are input LLRs and $\hat{u}_{sum}$ is the sum (modulo 2) of preceding bits in the path. The number of f/g processing engines 412 can be chosen as desired. In some embodiments, the number of f/g processing engines 412 is at least equal to 2L (the maximum number of candidates generated at a given stage). Since the number of f/g computations for a given stage may be larger than 2L, having more than 2L f/g processing engines 412 can decrease processing time for a decoding stage (which can increase throughput) but can also increase area, and selecting the optimal value involves a design tradeoff. In some embodiments, f/g processing engines 412 can implement radix-4 processing to further increase throughput; an example is described below.

Metric computation unit 410 can coordinate operation of f/g processing engines 412 to compute f and g functions for updating the path metrics (or LLRs) for particular nodes in the binary tree for a codeword. For instance, metric computation unit 410 can determine, based on the current decoding stage and candidate lists, which LLRs should be updated and can provide the appropriate inputs to f/g processing engines 412. Depending on implementation, reading of the input LLRs from LLR memory 312 can be done by metric computation unit 410 or by f/g processing engines 412. (For instance, metric computation unit 410 can assign read addresses to f/g processing engines 412.) As f/g processing engines 412 compute updated LLRs, the updated LLRs can be written to LLR memory 312. Again, depending on implementation, writing to LLR memory 312 can be done by metric computation unit 410 or by f/g processing engines 412. In many respects, the implementation and operation of metric computation unit 410 can be similar to comparable circuits in existing SCL polar decoders.

Metric computation unit 410, however, can be configured for multithreaded operation, with each thread corresponding to a different codeword that is in the process of being decoded. The different codewords can be independent of each other and can be in different stages of decoding at any given time. A thread context register file 420 can provide registers to store context information for each concurrent thread. In some embodiments, the context information for a thread (or codeword) can include the current list of candidates, the current path metric for each candidate, a memory offset or other pointer to identify the location of the corresponding LLRs in LLR memory 312 (e.g., one of codeword storage regions 404), an indicator of the current stage of decoding (e.g., number of stages completed and/or number of stages remaining), codeword size, a frozen-bit map identifying the set of frozen bits for the codeword, and any other information that may apply to specific codewords.

Operation of LLR update engine 310 can proceed as follows. In response to a "Go" signal from synchronization logic 350, metric computation unit 410 can switch to the next thread. In some embodiments, metric computation unit 410 advances cyclically through existing threads, e.g., based on position in thread context register file 420. Metric computation unit 410 can read the current context from thread context register file 420 and the sorted candidate list from input registers 458. Based on this information, metric computation unit 410 can select input LLRs for f/g processing engines 412, receive output from f/g processing engines 412, and compute an updated candidate list for the codeword of the current thread. Once the updated candidate list has been computed, metric computation unit 410 can load the unsorted candidate list (e.g., up to 2L candidates), including the path metric and a candidate identifier for each candidate, into registers 452. After loading the candidates into registers 452, metric computation unit 410 can send a "Ready" signal to synchronization logic 350 and wait for the next "Go" signal before proceeding to the next thread.

The number of cycles needed for LLR update engine 310 to generate an updated candidate list for a thread (or codeword) can be variable. For instance, as noted above, some bits of a codeword may be frozen bits, for which fewer f/g computations may be needed. As another example, at early stages of decoding (the first few levels of the tree), there may not yet be L candidates. In some embodiments, LLR update engine 310 can continue to process the thread for a newly received codeword until reaching the first decoding stage at which L candidates exist, at which point sorting and culling of the candidate list becomes enabled. For example, if L=8, it is at the fourth level of the binary tree (or fourth stage of decoding) that the number of candidates becomes greater than L. Accordingly, LLR update engine 310 with L=8 can perform the first four stages of path metric computation for a thread before sending the "Ready" signal to synchronization logic 350. Thereafter, LLR update engine 310 can generate a "Ready" signal for each decoding stage.

Figure 5:
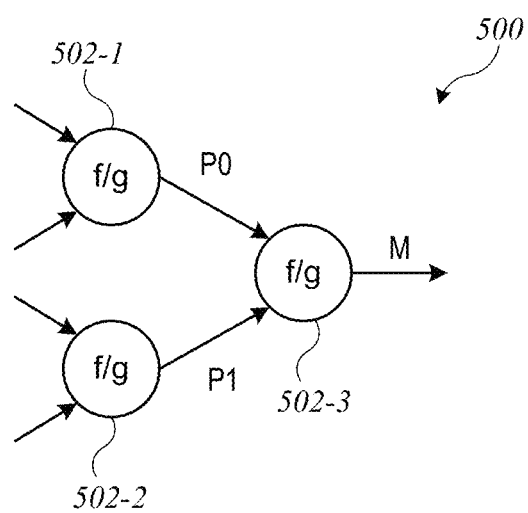
FIG. 5 shows a simplified schematic diagram of a radix-4 f/g processing engine according to some embodiments.

In some embodiments, further acceleration of LLR computations can be provided by providing multi-stage f/g processing engines. FIG. 5 shows a simplified schematic diagram of a two-stage (also referred to as "radix-4") f/g processing engine 500 according to some embodiments. In some embodiments, f/g processing engine 500 can be used to implement each processing engine 412 in LLR update engine 310.

Radix-4 f/g processing engine 500 includes three f/g arithmetic circuits 502-1 through 502-3. Each f/g arithmetic circuit 502 can be of identical design and can be configured to compute f and g functions, e.g., according to Eq. (1) and Eq. (2). In some embodiments, selection logic within each f/g arithmetic circuit 502 can be controlled to determine whether the f function or the g function output, which can depend on the particular node and stage of decoding; those skilled in the art will be familiar with the algorithms. Alternatively, if desired, both f and g functions can be output. The f/g arithmetic circuits 502 are arranged in a tree, with four inputs at the first level. A first f/g arithmetic circuit 502-1 produces an output P0 from two of the inputs, and a second f/g circuit 502-2 produces an output P1 from the other two inputs. The third f/g arithmetic circuit 502-3 operates on P0 and P1 to produce a final output M. Thus, radix-4 f/g processing engine 500 implements a computation that corresponds to two stages along a candidate path. In some embodiments, radix-4 f/g processing engine 500 can complete a computation of the final output M in one cycle rather than three cycles for a radix-2 engine because the number of memory accesses is reduced.

The inputs to radix-4 f/g processing engine 500 can be LLRs for nodes associated with the current codeword and the current stage of decoding. Metric computation unit 410 can identify the input LLRs based on the stage in decoding and the position of a particular node and dispatch instructions to radix-4 f/g processing engine 500. In some embodiments, the instructions can include input memory addresses, and radix-4 f/g processing engine 500 can be configured to read the input LLRs from LLR memory 312. In other embodiments, metric computation unit 410 can read the LLRs from LLR memory 312 and provide the LLRs as operands to radix-4 f/g processing engine 500. Likewise, in some embodiments, the instructions can include an output memory address, and radix-4 f/g processing engine 500 can be configured to write the result to LLR memory 312 (in addition or instead of providing the result to metric computation unit 410); in other embodiments, radix-4 f/g processing engine 500 can provide the results to metric computation unit 410, and metric computation unit 410 can manage the writing to LLR memory 312.

The outputs of radix-4 f/g processing engine 500 can be updated LLRs that are written back to LLR memory 312. In some embodiments, the intermediate outputs P0 and P1 as well as the final output M are all written back to memory. The final output M can be used for path metric computation at the current decoding stage (intermediate outputs P0 and P1 are not needed), but the intermediate outputs P0 and P1 may be useful for the next decoding stages. In some embodiments, organization of LLR memory 312 can be optimized so that writing of the M and P0, P1 LLRs (which belong to different decoding stages) does not cause bank conflicts.

It should be understood that the implementation of f/g processing engines 412 in LLR engine 410 can be varied. In various embodiments, f/g processing engines 412 can be radix-2 engines, radix-4 engines (e.g., as shown in FIG. 5), or larger-radix engines. In some embodiments, it may be desirable that an f/g processing engine 412 complete its computation in one clock cycle, and this may limit the radix. In addition, f/g processing engines with large radix may complicate the logic in metric computation unit 410 for determining a next computation to perform. If desired, different f/g engines 412 in the same LLR engine 310 can have different radices; again, this may complicate the logic in metric computation unit 410 as compared to having the same configuration for all f/g processing engines 412.

Figure 6:
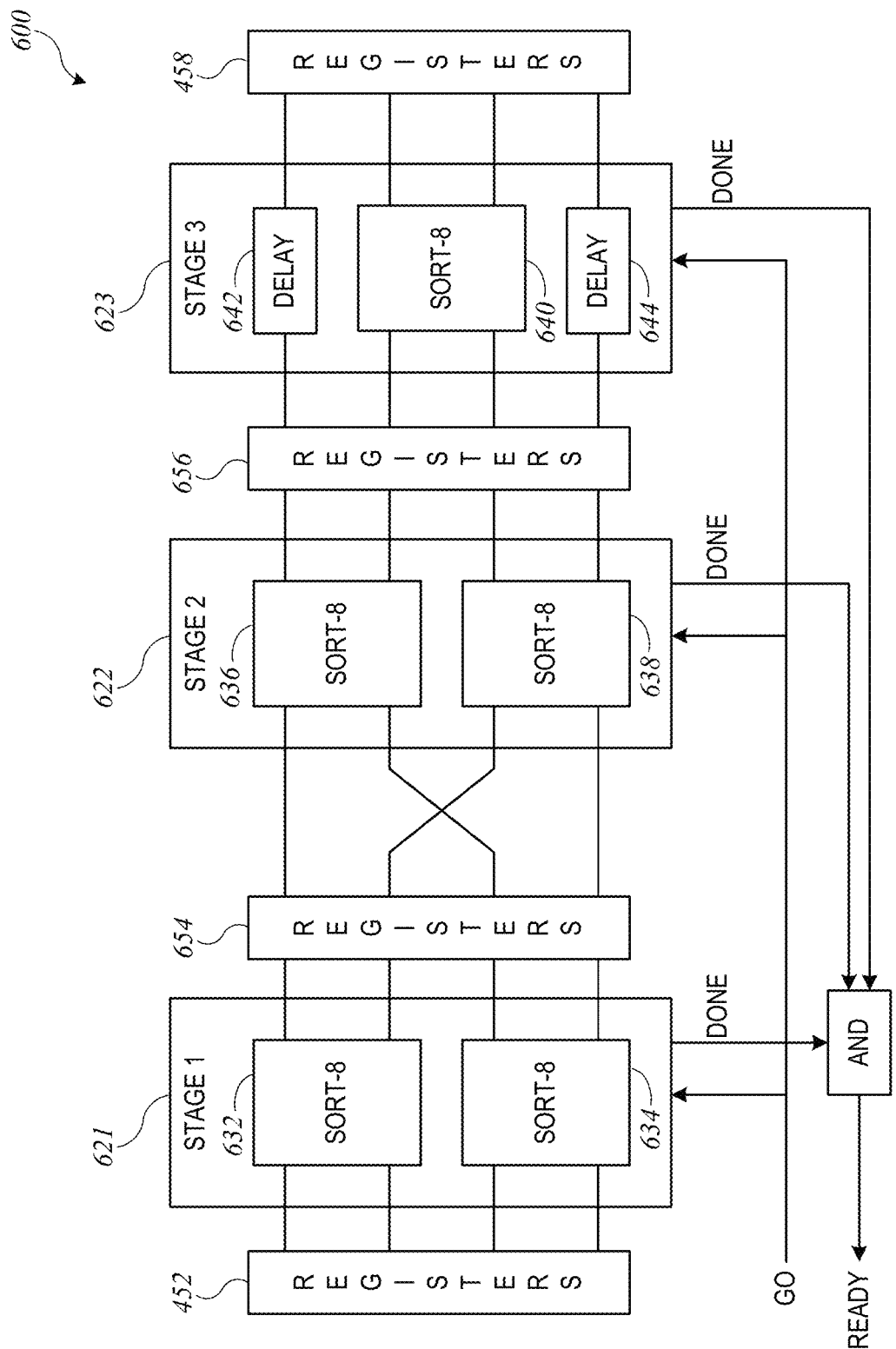
FIG. 6 shows a simplified schematic diagram of a sort engine for a multithreaded SCL polar decoder circuit according to some embodiments.

Once LLR update engine 310 has loaded an updated candidate list into registers 452, the candidate list is ready for sorting by sort engine 320. FIG. 6 shows a simplified schematic diagram of a sort engine 600 according to some embodiments. Sort engine 600 can be an implementation of sort engine 320 of FIG. 3 in SCL polar decoder circuit 300. In this example, it is assumed that L=8 candidates survive at each decode stage. To select the survival candidates, sort engine 600 can sort a list of 2L=16 candidates using three sort stages 621-623. Sort stage 621 can include two 8-element sort units 632, 634. Sort stage 622 can include two 8-element sort units 636, 638. Sort stage 623 can include one 8-element sort unit 640. Each 8-element sort unit 632, 634, 636, 638, 640 can have an identical configuration that receives a set of eight elements in an unsorted order and produces a set of eight elements in sorted order. The elements can represent candidates, with each element including a path metric that is used for sorting and a candidate identifier that is propagated along with the path metric. Sort units 632, 634, 636, 638, 640 can be implemented using a variety of techniques, such as a network of compare-and-swap circuits. FIG. 6 shows simplified connection paths between 8-element sort units 632, 634, 636, 638, 640, with each connection path representing a group of four elements. Outputs of each sort unit 632, 634, 636, 638, 640 can be arranged in sorted order relative to each other. With the connections shown, circuit 600 can sort an input set of 16 elements to produce an output set of 16 elements. Assuming that the sort units 632, 634, 636, 638, 640 are identically configured, each stage 621-623 can be completed in the same number of cycles. (The number of cycles depends on the particular implementation of the sort units.) It should be understood that the data elements propagated through sort engine 600 can include both a candidate identifier and a path metric. Sorting is performed on the path metrics, and the candidate identifiers can be carried along with the path metrics.

Register sets 452, 654, 656, and 458 can each include 16 registers (one per candidate), with different registers coupled to different input and/or output paths of sort engines 632, 634, 636, 638, 640 as indicated in the drawing. Register sets 452, 654, 656, and 458 can facilitate synchronization of multiple concurrent threads between sort engine 600 and LLR update engine 310. For instance, input registers 452 of sort circuit 600 can be the output registers 452 of LLR update engine 310 (shown in FIG. 4), and output registers 458 of sort engine 600 can be the input registers 458 of LLR update engine 310 (also shown in FIG. 4). As described above, after loading candidates into registers 452, LLR update engine 310 can send the "Ready" signal to synchronization logic 350. Synchronization logic 350 can send the "Go" signal to sort engine 600 and LLR update engine 310 simultaneously. In response to the "Go" signal, each sort stage can operate its sort unit(s) on its input registers, while LLR update engine 310 can begin operating on another thread (or codeword). For example, sort stage 621 can read from registers 452, operate sort units 632, 634 and write the outputs to registers 654. At the same time, sort stage 622 can read from registers 654, operate sort units 636, 638, and write the outputs to registers 656. At the same time, sort stage 623 can read from registers 656, operate sort unit 640, and write the outputs to registers 458. In some embodiments, sort stage 623 can include delay circuits 642, 644 that delay the inputs that are not operated on by sort unit 640 for a time equal to the operating time of sort unit 640, so that the outputs of sort stage 623 arrive concurrently at registers 458. In some embodiments, sort stages 621, 622, 623 can generate respective "Done" signals when the sorted outputs have been loaded into the output registers 654, 656, 658 of the stage, and sort engine 600 can send a "Ready" signal to synchronization logic 350 when all stages 621, 622, 623 report "Done," as indicated by three-input AND circuit 660. Other implementations are also possible. For instance, each sort stage 621-623 can send a separate "Ready" signal to synchronization logic 350, and synchronization logic 350 can generate the "Go" signal when all sort stages 621-623 and LLR update engine 310 have signaled "Ready." In some embodiments, the number of cycles consumed by each sort stage is constant, and synchronization logic 350 can be configured to use a timer to determine when sort engine 600 is ready to advance to the next thread rather than using a "Ready" signal.

Using synchronization logic 350, multiple concurrent threads corresponding to decoding of different codewords can cycle through the LLR update and sorting stages. Each codeword can be processed by each stage in turn, independently of any other codewords. FIG. 7 shows a timing chart further illustrating multithreaded operation of circuit 300 according to some embodiments. For purposes of description, it is assumed that LLR update engine 310 is implemented as shown in FIG. 4 with L=8 and that sort engine 600 is implemented with three sort stages as shown in FIG. 6. In this example, up to four threads corresponding to four different codewords can be concurrently executing. To illustrate the multithreading behavior, FIG. 7 shows a "step" counter (column 701). The step counter increments each time synchronization logic 350 sends the "Go" signal to LLR update engine 310 and sort engine 600. (The step counter is used herein for convenience of description, and circuit 300 can but need not maintain a step counter.) Letters A, B, C, D, E correspond to different codewords that are being decoded. At each step, the letter in a particular column indicates the codeword being processed by LLR update engine 310 (column 702), sort stages 621-623 (columns 703), and output engine 330 (column 706).

When a first "Go" signal is received (step 1), LLR update engine 310 can begin to process a first codeword (A). If codeword A is the first codeword to be decoded, sort engine 600 can be idle. In some embodiments, the first processing stage for a new codeword can include loading LLRs for the received bits into one of codeword storage regions 404 in LLR memory 402. As described above, after performing one or more decoding stages, LLR update engine 310 can write an (unsorted) candidate list for codeword A into registers 452, then send a "Ready" signal to synchronization logic 350. In response to the "Ready" signal, synchronization logic 350 can send the "Go" signal to LLR update engine 310 and sort engine 600 (and output engine 330, although in this example there is nothing yet for output engine 330 to process). In response to the "Go" signal (step 2), sort stage 621 can operate on the candidate list for codeword A while LLR update engine 310 begins processing a different codeword (B). After sort stage 621 has finished and LLR update engine 310 has written an (unsorted) candidate list for codeword B into registers 452, synchronization logic 350 can send another "Go" signal. At step 3, sort stage 622 can operate on the candidate list for codeword A, sort stage 621 can operate on the candidate list for codeword B, and LLR update engine 310 can begin to process a third codeword (C). In response to the next "Go" signal (step 4), sort stage 623 can operate on the candidate list for codeword A, sort stage 622 can operate on the candidate list for codeword B, sort stage 621 can operate on the candidate list for codeword C, and LLR update engine 310 can begin to process a fourth codeword (D). At the end of step 4, the sorted candidate list for codeword A is ready in registers 458. Accordingly, in response to the next "Go" signal (step 5), LLR update engine 310 can compute path metrics for the next decoding stage for the L surviving candidates for codeword A, while sort stages 623, 622, and 621 operate on candidate lists for codewords B, C, and D. Operation can continue in this manner, with codewords A, B, C, and D cycling through iterations of LLR updating and sorting, until decoding of a codeword (e.g., codeword A) reaches the final stage (step 37 in this example). At the final stage, the candidate list at the input registers 458 of LLR update engine 310 includes the L surviving candidates after the last iteration of LLR updating and sorting. At that point, LLR update engine 310 can provide the L surviving candidates to output engine 330. Output engine 330 can perform final processing as described above to produce the decoder output for codeword A. At steps 38-40 an idle period can propagate through sort stages 621-623. At step 41, which would have been codeword A's next turn in LLR update engine 310, LLR update engine 310 can begin processing a new codeword (E). This cyclic advancement of threads through the LLR update and sorting stages can allow synchronization logic 350 to have a simple (low-cost) design while significantly increasing the utilization of LLR update engine 310 and sort engine 600.

In this example, sort engine 600 does not need to maintain context information for different threads. Instead, each sort stage 621, 622, 623 can simply sort whatever elements are in input registers 452, 654, 656 and write the result to registers 654, 656, 458. LLR update engine 310 can maintain context information for each thread (e.g., in thread context register file 420) so that when the sorted candidate list for a particular thread is returned from sort engine 600, LLR update engine 310 can perform the next stage of decoding for that thread. Cycling through the concurrent threads in the manner described herein can allow for simple thread-selection logic: at each "Go" signal, LLR update engine 310 can advance to the next thread in thread context register file 420.

In some embodiments, different codewords can require different numbers of stages of decoding. Each codeword can be output as decoding of that codeword is completed, and a new codeword can be inserted into the cycle in place of the completed codeword. In this manner, the utilization of LLR update engine 310 and sort engine 320 and throughput of circuit 330 can be increased. It should be understood that LLR update engine 310 and sort stages in sort engine 320 need not consume the same number of clock cycles per step. As described above, "Ready" and "Go" signals can be used to synchronize the operations of different engines so that the threads advance synchronously even if the number of clock cycles used by different engines are different. To the extent that the time requirements for LLR update engine 310 and sort stages 322 in sort engine 320 can be made similar, utilization can be increased.

While specific embodiments have been described, those skilled in the art will appreciate that variations and modifications are possible. For instance, SCL polar decoding can use any number of candidate lists. Definitions of the path metrics and particular functions and algorithms for updating path metrics can be chosen as desired. In some embodiments, multi-bit decoding can be implemented, in which a few adjacent bits in the codewords are grouped into a node and hard decoding is done one node at a time. With appropriate logic in LLR update engine 310, multithreading techniques described herein can be applied to multi-bit decoding and to other variations of SCL polar decoding. Sorting can proceed in any number of stages, including as few as one sort stage, in which case one thread can be active in the LLR update engine while one other thread is active in the sort engine. It should be understood that for a candidate list of a given length, defining more sort stages can result in each stage consuming fewer clock cycles, which may reduce the utilization of the sort stages unless the number of clock cycles consumed per stage in the LLR update engine is correspondingly reduced. As noted above, the optimal configuration may involve design tradeoffs between area and throughput. The synchronization logic can also be modified, and different signals or combinations of signals can be used to synchronize the LLR update and sort stages. Separate LLR memories can be provided for different codewords; however, using a single memory for all the codewords can reduce the memory area. In embodiments where not more than one thread at a time is active in the LLR update engine, using separate LLR memories for different codewords may have little benefit.

In some embodiments, multithreaded SCL polar decoding circuits of the kind described herein can be implemented in decoding pipelines for PDCCH (or PUCCH) data, e.g., for 5G radio area networks. However, embodiments are not limited to any particular application, and multithreaded SCL polar decoding circuits can be used in any processor or other device where decoding of polar-coded data is desired.

All processes described herein are illustrative and can be modified. Operations can be performed in a different order from that described, to the extent that logic permits; operations described above may be omitted or combined; and operations not expressly described above may be added.

Unless expressly indicated, the drawings are schematic in nature and not to scale. All numerical values presented herein are illustrative and not limiting. Reference to specific standards for cellular data communication (e.g., 4G LTE or 5G NR) are also for purposes of illustration; those skilled in the art with access to the present disclosure will be able to adapt the devices and methods described herein for compatibility with other standards.

The present disclosure includes references to "an embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise" or "can arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must). The word "can" is used herein in the same permissive sense (i.e., having the potential to, being able to).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set {w, x, y, z}, these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set {w, x, y, z}, thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some tasks even if the structure is not currently being operated. Thus, an entity described or recited as being "configured to" perform some tasks refers to something physical, such as a device, circuit, a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, Applicant will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

What is claimed is:

1. A polar decoder comprising:
 a log likelihood ratio (LLR) memory having a plurality of storage areas configured to store LLRs associated with nodes in a binary tree representing a space of possible decoded codewords corresponding to a received codeword, wherein different storage areas store LLRs for different received codewords;
 a multithreaded LLR update engine coupled to the LLR memory and configured to:
  update the LLRs stored in the storage areas of the LLR memory;
  compute path metrics for a plurality of candidate paths through a portion of the binary tree corresponding to a current decoding stage; and
  write updated path metrics for the plurality of candidate paths for the current decoding stage to a first set of registers;
 a sort engine coupled to the LLR update engine and having one or more sort stages configured to operate sequentially to sort the plurality of candidate paths from the first set of registers based on the path metrics and to write the sorted candidate paths to a second set of registers,
 wherein the LLR update engine and the sort engine operate iteratively to traverse the binary tree during a series of decoding stages to generate a final list of candidates for a decoded codeword corresponding to a received encoded codeword; and
 synchronization logic coupled to the LLR update engine and the sort engine, the synchronization logic configured to generate synchronization signals such that the multithreaded LLR update engine and the one or more sort stages of the sort engine operate concurrently on different threads of a plurality of threads corresponding to different received codewords.

2. The polar decoder of claim 1 wherein the LLR update engine includes a thread context register file configured to store context information for each of the plurality of threads.

3. The polar decoder of claim 2 wherein the context information includes the candidate paths and path metrics for a particular thread.

4. The polar decoder of claim 2 wherein the context information includes an indicator of a decoding stage for a particular thread.

5. The polar decoder of claim 1 wherein the LLR update engine implements successive cancellation list (SCL) polar decoding.

6. The polar decoder of claim 5 wherein the LLR update engine maintains at least eight candidate paths.

7. The polar decoder of claim 1 wherein the plurality of threads includes a number of threads that is one greater than a number of sort stages in the sort engine.

8. The polar decoder of claim 1 wherein the LLR update engine includes a plurality of radix-4 f/g processing engines configured to perform f/g computations for three nodes.

9. The polar decoder of claim 1 wherein the sort engine includes at least two sort stages and different sort stages operate concurrently on different threads of the plurality of threads.

10. The polar decoder of claim 1 further comprising:
an output engine coupled to the LLR update engine, the output engine configured to produce a decoded codeword based on a final set of candidate paths provided by the LLR update engine.

11. A cellular modem processor comprising:
a decoder pipeline, the decoder pipeline including a polar decoder circuit, wherein the polar decoder circuit includes:
a log likelihood ratio (LLR) memory having a plurality of storage areas configured to store LLRs associated with nodes in a binary tree representing a space of possible decoded codewords corresponding to a received codeword, wherein different storage areas store LLRs for different received codewords;
a multithreaded LLR update engine coupled to the LLR memory and configured to:
update the LLRs stored in the storage areas of the LLR memory;
compute path metrics for a plurality of candidate paths through a portion of the binary tree corresponding to a current decoding stage; and
write updated path metrics for the plurality of candidate paths for the current decoding stage to a first set of registers;
a sort engine coupled to the LLR update engine and having one or more sort stages configured to operate sequentially to sort the plurality of candidate paths from the first set of registers based on the path metrics and to write the sorted candidate paths to a second set of registers,
wherein the LLR update engine and the sort engine operate iteratively to traverse the binary tree during a series of decoding stages to generate a final list of candidates for a decoded codeword corresponding to a received encoded codeword; and
synchronization logic coupled to the LLR update engine and the sort engine, the synchronization logic configured to generate synchronization signals such that the multithreaded LLR update engine and the one or more sort stages of the sort engine operate concurrently on different threads of a plurality of threads corresponding to different received codewords.

12. The cellular modem processor of claim 11 wherein the decoder pipeline is configured to decode a physical downlink control channel (PDCCH) for a 5G radio area network.

13. The cellular modem processor of claim 11 wherein the sort engine includes at least two sort stages and different sort stages operate concurrently on different threads of the plurality of threads.

14. The cellular modem processor of claim 11 wherein the plurality of threads includes a number of threads that is one greater than a number of sort stages in the sort engine.

15. The cellular modem processor of claim 11 wherein the LLR update engine implements successive cancellation list (SCL) polar decoding.

16. The cellular modem processor of claim 11 wherein the polar decoder circuit further comprises:
an output engine coupled to the LLR update engine, the output engine configured to produce a decoded codeword based on a final set of candidate paths provided by the LLR update engine.

17. A method of operating a polar decoder circuit having a log likelihood ratio (LLR) update engine and a sort engine having one or more sort stages, the method comprising:
computing, in the LLR update engine, path metrics for a set of candidate paths for a first codeword;
concurrently with computing the path metrics, sorting, in the sort engine, respective sets of candidate paths for one or more additional codewords including a second codeword;
responsive to completion of computing the path metrics for the set of candidate paths for the first codeword and sorting of the set of candidate paths for the one or more additional codewords, advancing the set of candidate paths for the first codeword to the sorting engine and advancing the set of candidate paths for the second codeword to the LLR update engine; thereafter
computing, in the LLR update engine, updated path metrics for an updated set of candidate paths for the second codeword; and
concurrently with computing the updated path metrics, sorting, in the sort engine, a set of candidate paths for one or more additional codewords including the first codeword.

18. The method of claim 17 wherein the one or more additional codewords includes at least a second codeword and a third codeword and wherein sorting respective sets of candidate paths for one or more additional codewords includes:
sorting a set of candidate paths for the second codeword in a first stage of the sort engine; and
sorting a set of candidate paths for the third codeword in a second stage of the sort engine,
wherein the first and second stages of the sort engine operate concurrently.

19. The method of claim 17 wherein:
computing the path metrics for the first codeword includes reading LLRs from a first region in an LLR memory; and
computing the path metrics for the second codeword includes reading LLRs from a second region in the LLR memory.

20. The method of claim 17 further comprising:
determining, by the LLR update engine, that a final stage of decoding for the first codeword is complete; and
in response to determining that the final stage of decoding for the first codeword is complete, generating, by an output engine of the polar decoder circuit, a decoded codeword for the first codeword.

* * * * *